US005729263A

United States Patent [19]

Thiel et al.

[11] Patent Number: 5,729,263

[45] Date of Patent: Mar. 17, 1998

[54] ARRANGEMENT FOR PLATE-SHAPED PIEZOACTUATORS AND METHOD FOR THE MANUFACTURE THEREOF

[75] Inventors: Wolfgang Thiel; Junming Zhang, both of Berlin, Germany

[73] Assignee: Francotyp-Postalia AG & Co., Birkenwerder, Germany

[21] Appl. No.: 507,214

[22] Filed: Jul. 26, 1995

[30] Foreign Application Priority Data

Aug. 3, 1994 [DE] Germany .......................... 44 28 847.6

[51] Int. Cl.[6] .......................... H01L 41/08

[52] U.S. Cl. .......................... 347/71; 310/328

[58] Field of Search .......................... 347/71; 310/328, 310/357, 358, 359

[56] References Cited

U.S. PATENT DOCUMENTS

| | | |
|---|---|---|
| 4,551,647 | 11/1985 | Day . |
| 4,703,333 | 10/1987 | Hubbard . |
| 4,752,788 | 6/1988 | Yasuhara et al. . |
| 4,897,903 | 2/1990 | Johannesen . |

FOREIGN PATENT DOCUMENTS

| | | |
|---|---|---|
| 0 469 916 | 2/1992 | European Pat. Off. . |
| 0 486 256 | 5/1992 | European Pat. Off. . |
| 0 494 401 | 7/1992 | European Pat. Off. . |
| 0 516 284 | 12/1992 | European Pat. Off. . |
| 0 572 230 | 1/1993 | European Pat. Off. . |
| 0 616 890 | 9/1994 | European Pat. Off. . |
| 36 28 346 | 2/1988 | Germany . |
| 37 01 470 | 7/1988 | Germany . |
| 37 10 654 | 10/1988 | Germany . |
| 37 33 109 | 4/1989 | Germany . |
| 38 05 279 | 8/1989 | Germany . |
| 42 25 799 | 2/1994 | Germany . |
| 94 04 328 | 6/1994 | Germany . |
| WO 89/00920 | 2/1989 | WIPO . |
| WO 89/00921 | 2/1989 | WIPO . |
| WO 93/25390 | 12/1993 | WIPO . |

OTHER PUBLICATIONS

Patents Abstracts of Japan, M–1231, Apr. 7, 1992, vol. 16, No. 137, Japanese Application No. 2–99886.

*Primary Examiner*—Daniel P. Malley
*Attorney, Agent, or Firm*—Hill, Steadman & Simpson

[57] ABSTRACT

In a method and apparatus for producing an ink jet printer head composed of a number of stacked modules, a piezoactuator plate is formed by metallizing opposite major faces of a plate of piezoelectric material, while leaving an unmetallized stripe on one of said major faces, thereby separating the metallization on that major face into two regions. A side face of the piezoelectric plate is also metallized, the side face extending substantially parallel to the unmetallized stripe, thereby electrically connecting one of the metallized regions on one major face to the metallized layer on the opposite major face. The metallized piezoelectric plate is then structured so as to produce a number of side-by-side piezoactuators therein, each piezoactuator having first and second electrodes formed by the respective metallization on the opposite sides of the plate. Respective electrical leads for the two electrodes of each piezoactuator can be electrically contacted to the same side of the plate, i.e. the side having the non-metallized stripe thereon.

4 Claims, 2 Drawing Sheets

ARRANGEMENT FOR PLATE-SHAPED PIEZOACTUATORS AND METHOD FOR THE MANUFACTURE THEREOF

BACKGROUND OF THE INVENTION

1. Field of the Invention

The invention is directed to a plate-shaped piezoactuator assembly and to a method for manufacturing such an assembly, particularly for ink printer heads that are assembled of ink printer modules in stacked fashion.

2. Description of the Prior Art

Ink printer heads assembled of stacked ink printer modules are employed in small, fast printers that are in turn a component of moderate machines for franking postal matter or for printing addresses. Differing from standard office printers having line-by-line imprinting, printing in these machines ensues as a one-time franking impression in one pass of the postal matter. Corresponding to this significantly greater print width—approximately one inch—, the number of ink nozzles to be arranged under one another, and thus the number of piezoactuators in an ink printer head, is substantially larger than in the case of ink printer heads for office printers. In order to satisfy the current customer desire to print blocks with words as well as image characters in a postage meter machine with good print quality, printer resolutions of approximately 200 dpi are required, which means ink printer heads having the same number of nozzles and piezoactuators given a printing width of one inch. Of necessity, such ink printer heads are implemented in a planar or stacked structure; first, for reasons of allowable dimensions, and thus the packing density to be achieved and, second, for reasons of an economical manufacture (see German OS 42 25 799).

Plate resonators are usually utilized as piezoactuators, a piezoelectric material, for example lead-zirconate-titinate (PZT), being provided between two metal electrodes. The carrier plate, which simultaneously serves as the diaphragm plate over the ink pressure chambers, for the piezoactuators can be composed of glass, ceramic, plastic or metal. In the latter instance, one electrode can be omitted; however, a conductive glue in then required.

The nature of the arrangement, application and contacting of the piezoactuators is thereby a critical problem.

German OS 37 10 654 discloses a planar ink printer head assembled of metal plates. One of the plates is a diaphragm plate of nickel having a plate thickness of 0.03 mm on which piezolaminae having a diameter of approximately 1 mm are arranged as drive elements for the pressure chambers in a number corresponding to the number of nozzles. The diaphragm plate is followed by a pressure chamber plate of nickel having a plate thickness of 0.2 mm; this corresponds to the desired height of the pressure chambers.

The piezolaminae are individually glued or soldered onto the diaphragm plate in the regions above the pressure chambers. The assembly and adjustment expenditures required therefor are substantial.

The conditions are also analogous in another known ink printer head, disclosed in U.S. Pat. No. 4,703,333. Here, the coatings of the piezoactuators facing away from the diaphragm plate are contacted to the terminals of a ribbon conductor.

German OS 38 05 279 further discloses a piezoelectric ink printer head having a solid-state piezoceramic body, this ink printer head having transducers arranged parallel side-by-side. Each transducer includes a planar, piezoelectric drive element, a pressure chamber, an ink channel and a nozzle. The pressure chambers, the ink channels and the nozzles are fashioned as cavities in a piezoceramic body. Each drive element has an outer electrode, an inner electrode and an active piezoceramic layer arranged between the electrodes. The drive elements are acoustically separated from one another by incisions in the active piezoceramic layer. The incisions are intended to prevent cross-talk between the individual drive elements. For manufacturing the solid-state piezoceramic member, piezoceramic green films are stacked on top of one another, pressed in a vacuum and sintered. A piezoceramic green foil is structured by etching; the cavities that have arisen correspond to the shape of the pressure chambers, the pressure chamber outlet as well as the ink channels. The etching ensues with spray etching or laser etching. An intermediate green foil of piezoceramic that is metallized on one side is placed onto the structured piezoceramic green foil. After the sintering, the piezoceramic of the intermediate green foil forms the pressure chamber walls, whereby the metallization lies at that side facing away from the pressure chambers. The metallization is produced by printing the intermediate green foil with a metal paste. After the sintering, it forms the inner electrodes connected to one another. An upper piezoceramic green foil is arranged on the intermediate green foil and the active piezoceramic layers arise therefrom after sintering.

After the sintering of the stacked and pressed piezoceramic green foils, the openings of the ink channels are uncovered by removing material on the basis of mechanical processing. The outer electrodes are applied onto the outer side of the active piezoceramic layers by sputtering using a mask or by silkscreening. This is followed by the polarization of the transducers and the separation of the drive elements. The piezoceramic member that has arisen in this way is contacted with terminals of a terminal ribbon and is introduced into a housing or a retainer frame.

In another known method for manufacturing a piezoceramic element for ink jet printers, see German OS 37 33 109, and that is likewise based on the sintering of piezoceramic green foils, sintering temperatures from 1100°–1300° C. in an oxygen atmosphere are required. Platinum or metals of the platinum group are utilized as electrode material that is suitable for the sintering process. These two latter solutions have the disadvantage that time-consuming and energy-consuming high-temperature processes and expensive electrode material are required. Moreover, only the finished, solid-state piezoceramic body can be polarized. The electrode material must be resistant to corrosion with respect to the ink since one electrode is accommodated in the ink chamber.

German OS 38 04 165 also discloses a method for equipping an ink jet print head with piezoactuators, whereby a piezoceramic plate is first firmly joined to a diaphragm plate and only then does a separation of the piezoactuators from the piezoceramic plate ensue. The diaphragm plate is composed of glass and the side thereof facing toward the piezoceramic plate provided with a zinc or nickel oxide layer. The two plates are joined with a glue. The piezoactuators are detached with a separating means such as a laser beam or a saw. In this way, the piezoceramic plate serves as an aid to assembly and prevent an incorrect polarization. The metal oxide layer on the glass plate constitutes the common electrode for the piezoactuators. A conductive glue is required so that a reliable contact is present between one side of the piezoactuator and the metal oxide layer. As is known, metal layers on a glass substrate have poor adhesion. Since the joint between the metallized glass diaphragm and the piezoactuators is subject to high mechanical loads due to the periodic oscillations, delamination of the metal layer from the glass can occur, and thus a failure of the printer module can result.

SUMMARY OF THE INVENTION

An object of the present invention is to simplify the manufacture of ink printer heads with respect to the piezo-actuator part.

More specifically, an object of the present invention is to provide an arrangement and a manufacturing method for plate-shaped piezoactuators for ink printer heads of the type initially described (i.e. a stacked assembly) which achieve an assembly without particular adjustment outlay, a reliable electrode and piezoactuator fastening without contact with the ink as well as a simple electrical contacting. High-temperature processes and conductive glues should not be used. The selection of material for the diaphragm plate should be independent of the piezoactuators.

The above objects are achieved in accordance with the principals of the present invention in a method and apparatus wherein a plate forming a plurality of piezoactuators is produced by metallizing both major faces of the plate, with one major face being completely and continuously metallized, so that the metallization is substantially coextensive with the major face, and the opposite major face is metallized with a continuous interruption extending parallel to one side of the plate. This produces a metallized plate having one major face completely covered with a metal layer forming an electrode, and an opposite major face with a non-metallized "stripe" thereon. The aforementioned one end is also metallized, so that the metallization from the non-continuously metallized major face continues around and over that end of the plate so as to provide an electrical connection from the non-continuously metallized face of the plate to the opposite, completely metallized face of the plate. This permits leads to be attached at only one side of the plate, i.e., the side having the non-metallized stripe. By virtue of the electrical connection which proceeds from that side of the plate to the opposite, completely metallized plate, however, an electrical circuit between both electrodes of the piezoplate is formed, even though leads need only be attached to one side of the plate. There is thus a piezoplate formed which has an active region and an inactive region, separated by the non-metallized stripe. The plate can be structured to form a desired number of individual piezoactuators, and the structured plate is then incorporated in a print head in combination with a diaphragm plate with leads of, for example, a ribbon conductor being individually connected to the respective piezoactuators.

As used herein, the term "active region" means a region of the piezoelectric plate, or a region of an individual piezoactuator, which is covered at opposite sides by electrodes, which can respectively be placed at different electrical potentials in order to excite the piezoelectric material between the electrodes, and thereby to eject ink. The term "inactive region" means a region of the piezoactuator plate, or a region of an individual piezoactuator which, by virtue of the electrode material on both sides of the piezoelectric material being at the same electrical potential, cannot be excited.

The method and assembly of the invention have a number of advantages.

Since both electrodes are accessible from the same side, contacting with leads is possible in the simplest possible way and in only one attachment direction. In addition to bonding and soldering, there is even the possibility of simple pressure contacting. The fashioning of the piezoactuator plate allows the use of appropriately tailored ribbon cables for the control with the connector module.

Dependent on whether a larger number of piezoactuators or only individual piezoactuators are to be applied, a simple assembly without complicated adjustment is possible due to the common connection via the active region. The additional space required is thereby insubstantial, particularly since a complete structuring and fabrication of the piezoactuators is likewise possible before application onto the diaphragm. Since the electrodes are applied directly onto the piezoceramic, a connection with good adhesion is achieved and a conductive glue can be eliminated. Instead, there is the possibility of selecting the glue such that a reliable glued connection is achieved between piezoactuator and diaphragm plate. Since the piezoactuators are separated from the ink chambers by the diaphragm plate, neither the electrodes nor the glued connection need be corrosion-resistant with respect to the ink. The electrodes are preferably a silver alloy. A complicated guidance of the electrodes out of the inside of the module is eliminated.

The inventive method and apparatus also allow the use of piezoplates that have already been coated with electrodes and polarized. Only one end face then need be subsequently metallized and only the structuring need then be undertaken, thus offering a wide range of technological freedom for these parts of the procedure.

DESCRIPTION OF THE PREFERRED EMBODIMENTS

Figure 1:
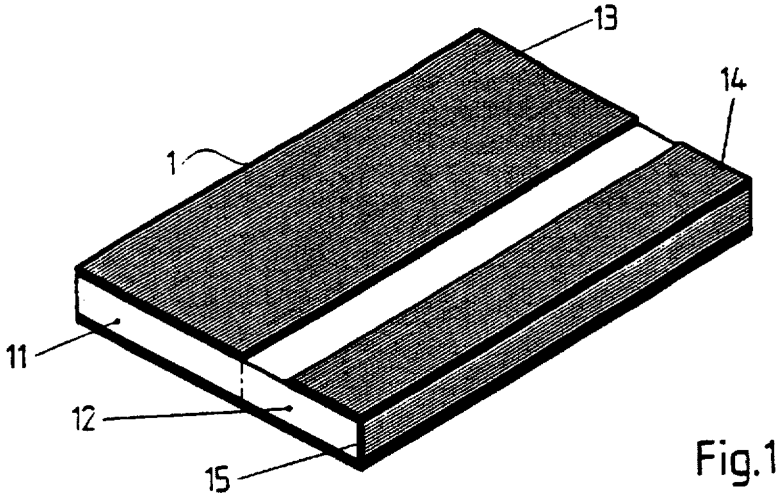
FIG. 1 is a perspective view of a piezoactuator constructed in accordance with the principals of the present invention.

As shown in FIG. 1, each piezoactuator 1 is a plate covered on both sides with electrodes 13, and 14, and has an active region 11 and an inactive region 12. One electrode 14 extends over an end face 15 of the piezoactuator 1 into the inactive region 12 of the opposite side.

Figure 2:
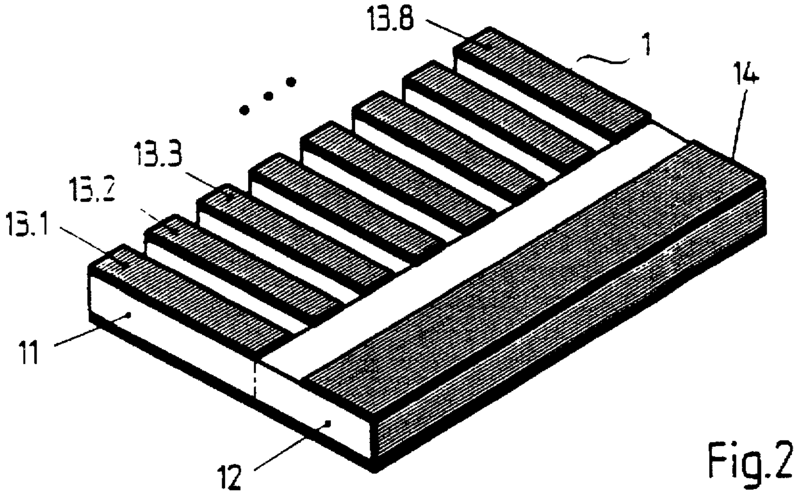
FIG. 2 is a perspective view of a piezoactuator plate with comb-like structure constructed in accordance with the principals of the present invention.
Figure 3:
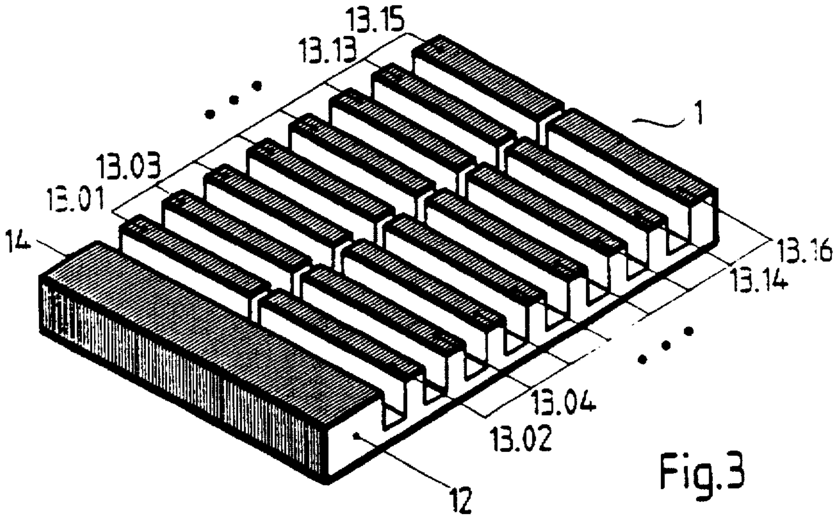
FIG. 3 is a perspective view of a piezoactuator plate having a bar-shaped structure constructed in accordance with the principals of the present invention.

As FIGS. 2 and 3 show, a number of piezoactuators 8×1, or 2×8×1, have a common inactive region 12 into which a common electrode 14 extends proceeding from the opposite side.

The piezoactuators 1 can be arranged comb-like according to FIG. 2 or bar-like according to FIG. 3. In any case, they are all identically constructed.

The electrodes 13.1, 13.2–13.8 and 14, 13.01, 13.02–13.16 and 14, are directly contacted with leads 21–28 and 20, 210–226 and 200, of a ribbon cable 2 for the drive.

Figure 4:
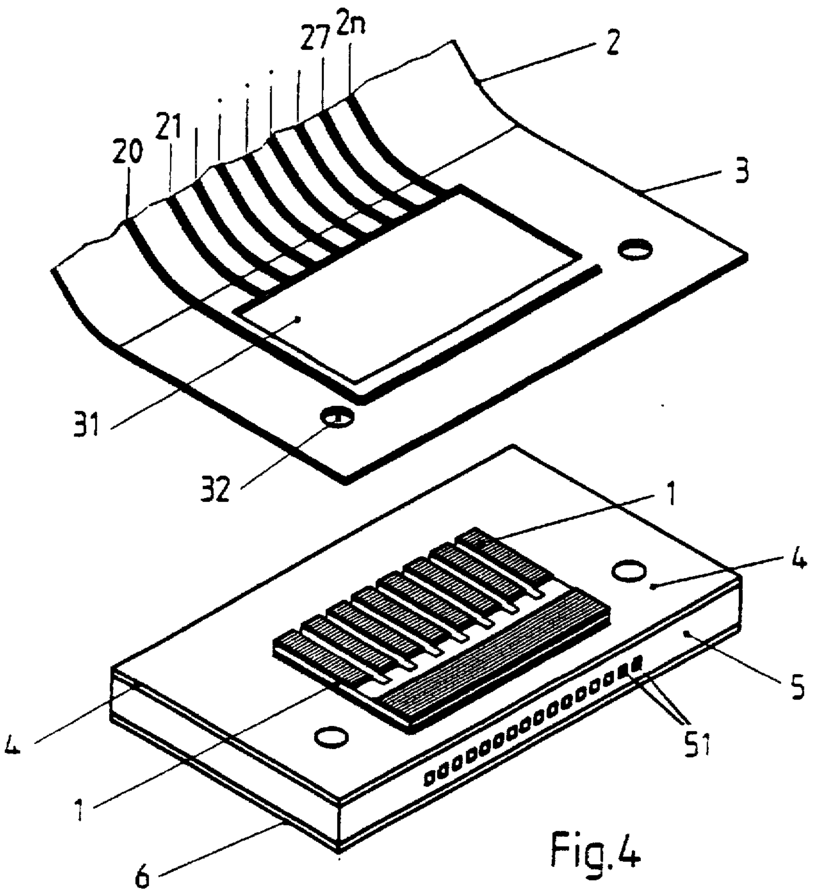
FIG. 4 is a perspective view of an ink printer module having piezoactuators in place and with the associated connector module in an exploded view of an assembly constructed in accordance with the principals of the present invention.

As can be seen in FIG. 4, the ribbon cable 2 can be provided with a connector module 3 that has recess 31 over the separating region between active and inactive region. The connector module 3 is put in place onto the piezoactuator plate 1 and the diaphragm plate 4 by means of adjustment bores 32. The piezoactuator 1 is seated on the diaphragm plate 4 such that the piezoactuators 1 lie in regions above ink printer chambers (not shown in greater detail). Upon excitation of a piezoactuator 1, ink droplets are sprayed from the nozzles 51 of a nozzle plate 5. The ink printer chambers, ink channels and nozzles are formed into the nozzle plate 5 in this case in a way that cannot be seen in the drawings. Given the version shown here, a second piezoactuator plate 1 likewise having eight piezoactuators 1 is coupled to the nozzle plate 5 at the underside thereof correspondingly offset over a diaphragm plate 6. The number of nozzles 51 is sixteen according to 2×8 piezoactuators.

Figure 5:
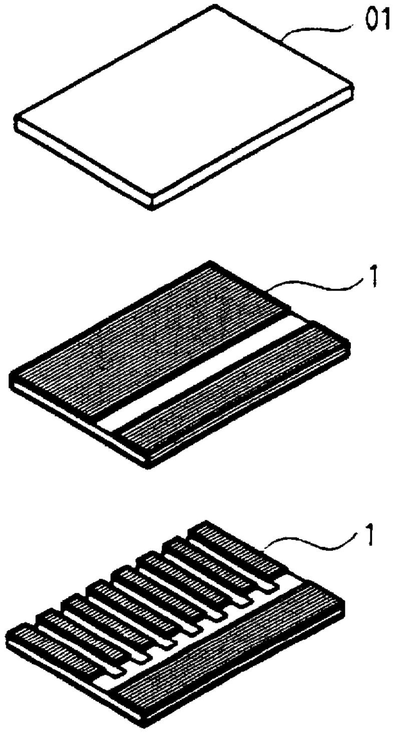
FIG. 5 is a schematic illustration of the manufacture of a piezoactuator plate in accordance with the principals of the present invention.

Several versions of the inventive manufacturing methods are possible for producing the inventive arrangement. The basic procedure is schematically shown in FIG. 5. A plate 1 of piezoelectric material such as, preferably, lead-zirconate-titinate, is metallized at least on its major faces and on one end face 15 with a suitable method. The metallization on one major face is continuously interrupted parallel to the metallized end face 15. A corresponding mask cover is thereby employed.

Subsequently, the plate 1 which has now been metallized is polarized in a standard way by applying a polarization voltage.

The major face of the polarized plate 1 which is continuously metallized is secured on a diaphragm plate 6 with a suitable glue, such as low-viscosity epoxy resin glue or an ultraviolet-curable glue, having a layer thickness of 1–5 μm.

The plate 1 is then structured with a suitable method such that a desired pattern of individual piezoactuators n×1—also see FIGS. 2 and 3—is present. Subsequently, the electrodes 13, 13.01–13.n, 14 of the structured plate 1 are contacted to allocated leads 20–2n of a ribbon cable 2 in a suitable way, such as bonding, soldering or pressure contacting via a connector module 3.

In a modification of the above-described method, the plate 1 is first structured after the metallization, is then glued polarized onto the diaphragm plate 6 and is finally contacted.

In further modification a piezoplate 1—a prefabricated component, already metallized at the major faces, is first polarized.

The structuring according to the desired pattern then follows.

The end face that lies parallel to the separating the line between the active and passive regions is then metallized, so that the electrode 14 extends into the inactive region of the opposite side as a result.

Finally, the plate 1, as previously, has the continuously metallized major face glued onto the diaphragm plate and the electrodes 13, 13.01–13n, 14 are subsequently contacted with the allocated leads of the ribbon cable 2.

The metallization can ensue by electroplating, sputtering, vapor deposition or silkscreening. A silver alloy is preferably employed as the metallization material. Aluminum alloys, however, may alternatively be used. The structuring can be undertaken by sawing, chemical etching, laser etching or sandblasting.

Although modifications and changes may be suggested by those skilled in the art, it is the intention of the inventors to embody within the patent warranted hereon all changes and modifications as reasonably and properly come within the scope of their contribution to the art.

We claim as our invention:

1. In an ink jet printer head having a plurality of stacked modules, including a piezoactuator plate having a plurality of piezoactuators disposed on a diaphragm plate in registry with respect ink chambers each piezoactuator having first and second electrodes with piezoelectric material disposed therebetween, and each piezoactuator further having first and second electrical leads respectively connected to said first and second electrodes, the improvement of each piezoactuator comprising:

an active region with said first and second electrodes disposed on opposite sides thereof;

an inactive region covered only by said second electrode, with said second electrode of said inactive region being disposed on a same side of said piezoactuator as the first electrode of said active region and said electrical leads being respectively connected to said first electrode and to said second electrode on said same side of said piezoactuator.

2. The improvement of claim 1 wherein all of said piezoactuators of said piezoactuator plate have a common inactive region covered by a common electrode formed by an extension of said second electrode from a side of said piezoplate opposite said same side, and wherein said electrical leads include a single common lead connected to said common electrode for all of said piezoactuators.

3. The improvement of claim 1 wherein said electrical leads comprise a ribbon cable, and wherein each piezoactuator is directly electrically connected to said ribbon cable.

4. The improvement of claim 1 wherein said electrical leads comprise a ribbon cable, and the improvement further comprising a connector module, with each piezoactuator being connected to said ribbon cable via said connector module.

* * * * *